(12) United States Patent
Park et al.

(10) Patent No.: US 10,008,544 B2
(45) Date of Patent: Jun. 26, 2018

(54) IMAGE SENSOR AND ELECTRONIC DEVICE INCLUDING THE SAME

(71) Applicant: Samsung Electronics Co., Ltd., Suwon-si, Gyeonggi-do (KR)

(72) Inventors: Kyung Bae Park, Hwaseong-si (KR); Yong Wan Jin, Seoul (KR); Moon Gyu Han, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 35 days.

(21) Appl. No.: 15/145,248

(22) Filed: May 3, 2016

(65) Prior Publication Data

US 2016/0380032 A1 Dec. 29, 2016

(30) Foreign Application Priority Data

Jun. 24, 2015 (KR) ........................ 10-2015-0089544

(51) Int. Cl.
*H01L 29/08* (2006.01)
*H01L 27/30* (2006.01)
*H01L 27/146* (2006.01)
*H01L 51/44* (2006.01)
*H01L 51/00* (2006.01)

(52) U.S. Cl.
CPC ...... *H01L 27/307* (2013.01); *H01L 27/14645* (2013.01); *H01L 27/14649* (2013.01);
(Continued)

(58) Field of Classification Search
CPC ......... H01L 27/14645; H01L 27/14649; H01L 27/307; H01L 51/0046; H01L 51/005;
(Continued)

(56) References Cited

U.S. PATENT DOCUMENTS 8,710,418 B2 4/2014 Natori
2008/0283728 A1 11/2008 Inoue
(Continued)

FOREIGN PATENT DOCUMENTS

JP 2008-204978 A 9/2008
JP 2009-027063 A 2/2009
(Continued)

OTHER PUBLICATIONS

Extended European Search Report dated Nov. 16, 2016 issued in corresponding European Patent Application No. 16175795.0.
(Continued)

*Primary Examiner* — Long K Tran
(74) *Attorney, Agent, or Firm* — Harness, Dickey & Pierce, P.L.C.

(57) ABSTRACT

An image sensor includes at least one first pixel configured to sense light in a visible light wavelength spectrum and a second pixel configured to sense light in an infrared light wavelength spectrum. The second pixel includes a first photoelectric device defined in the second pixel. The first photoelectric device includes an infrared light absorption layer between a first electrode and a second electrode and configured to selectively absorb light in an infrared spectrum. The second pixel may be configured to compensate the luminance sensitivity of the image sensor. The first and second pixels may be included in a unit pixel group. The image sensor may include an array of multiple unit pixel groups arranged in one or more rows and one or more columns.

29 Claims, 8 Drawing Sheets

(52) U.S. Cl.
CPC ............ *H01L 51/44* (2013.01); *H01L 51/441* (2013.01); *H01L 51/005* (2013.01); *H01L 51/008* (2013.01); *H01L 51/0046* (2013.01); *H01L 51/0067* (2013.01); *H01L 51/0068* (2013.01); *H01L 51/0071* (2013.01); *H01L 51/0072* (2013.01); *H01L 51/0078* (2013.01)

(58) Field of Classification Search
CPC ............ H01L 51/0067; H01L 51/0068; H01L 51/0071; H01L 51/0072; H01L 51/0078; H01L 51/008; H01L 51/44; H01L 51/441
USPC .......................................................... 257/40
See application file for complete search history.

(56) References Cited

U.S. PATENT DOCUMENTS

| 2009/0050881 | A1 | 2/2009 | Hayashi | |
|---|---|---|---|---|
| 2009/0140123 | A1 | 6/2009 | Shen et al. | |
| 2012/0044444 | A1* | 2/2012 | Park .................. | H01L 27/14623 349/106 |
| 2012/0056073 | A1 | 3/2012 | Ahn | |
| 2012/0193689 | A1 | 8/2012 | Park et al. | |
| 2012/0243077 | A1 | 9/2012 | Osawa et al. | |
| 2015/0287766 | A1 | 10/2015 | Kim et al. | |

FOREIGN PATENT DOCUMENTS

| JP | 2011-159800 A | 8/2011 |
|---|---|---|
| KR | 10-2008-0101699 A | 11/2008 |
| KR | 10-2012-0089120 A | 8/2012 |

OTHER PUBLICATIONS

IR cut filter Price : http://www.aliexpress.com/price/visible-light-filter_price.html.
Image Sensor World: http://image-sensors-world.blogspot.kr/2014/10/sony-announces-high-sensitivity-sensor.html (Oct. 2014).
Francesco Arca et al., "Near-Infrared Organic Photodiodes", IEEE Journal of Quantum Electronics, vol. 49, No. 12, Dec. 2013.

* cited by examiner

IMAGE SENSOR AND ELECTRONIC DEVICE INCLUDING THE SAME

CROSS-REFERENCE TO RELATED APPLICATION

This application claims priority to and the benefit of Korean Patent Application No. 10-2015-0089544 filed in the Korean Intellectual Property Office on Jun. 24, 2015, the entire contents of which are incorporated herein by reference.

BACKGROUND

1. Field

An image sensor and an electronic device including the same are disclosed.

2. Description of the Related Art

An imaging device generates an image and may store the same as an electrical signal. The imaging device includes an image sensor that dissembles the incident light into separate components according to incident light wavelength and converts each component to an electrical signal.

Image sensors have been increasingly miniaturized, and resolution of said miniaturized image sensors has been increased. Such miniaturization and resolution changes in image sensors may lead to difficulties in improving luminance sensitivity of image sensors and luminance of images generated under a low-illumination environment, such as a nighttime environment or an indoor environment.

SUMMARY

Some example embodiments provide an image sensor configured to impart high sensitivity and high luminescence characteristics even in a low-illumination environment.

Some example embodiments provide an electronic device including the image sensor.

According to some example embodiments, an image sensor includes at least one first pixel configured to sense light in a visible light wavelength spectrum and a second pixel configured to sense light in an infrared light wavelength spectrum, wherein the second pixel includes a first photoelectric device defined in the second pixel, and the first photoelectric device includes a first electrode and a second electrode facing each other and an infrared light absorption layer disposed between the first electrode and the second electrode, wherein the infrared light absorption layer is configured to selectively absorb light in an infrared wavelength spectrum.

The infrared light absorption layer may be disposed on an entirety of a surface of a unit pixel group of the image sensor, and the infrared light absorption layer may include a photoelectric conversion region disposed between the first electrode and the second electrode in the second pixel to provide a first photoelectric device and a non-photoelectric conversion region disposed in the first pixel.

The infrared light absorption layer may include at least one organic material.

The infrared light absorption layer may include at least one of a quinoid metal complex compound, a cyanine compound, an immonium compound, a diimmonium compound, a triarylmethane compound, a dipyrromethene compound, a diquinone compound, a naphthoquinone compound, an anthraquinone compound, a squarylium compound, a ryleme compound, a phthalocyanine compound, a naphthalocyanine compound, a perylene compound, a squaraine compound, a boron dipyrromethene compound, and a nickel-dithiol complex compound.

The first pixel may include a third pixel, a fourth pixel, and a fifth pixel configured to sense different wavelength spectrums from each other in the visible light wavelength spectrum, the third pixel may include a first photo-sensing device configured to selectively absorb first visible light having a maximum absorption wavelength ($\lambda_{max}$) from about 500 nm to about 580 nm, the fourth pixel may include a second photo-sensing device configured to selectively absorb second visible light having a maximum absorption wavelength ($\lambda_{max}$) of greater than or equal to about 400 nm and less than about 500 nm, and the fifth pixel may include a third photo-sensing device configured to selectively absorb third visible light having a maximum absorption wavelength ($\lambda_{max}$) of greater than about 580 nm and less than or equal to about 700 nm.

The first pixel may include a first color filter overlapped with the first photo-sensing device and configured to selectively transmit the first visible light, a second color filter overlapped with the second photo-sensing device and configured to selectively transmit the second visible light, and a third color filter overlapped with the third photo-sensing device and configured to selectively transmit the third visible light, and the second pixel may not include a color filter.

The first photo-sensing device, the second photo-sensing device, and the third photo-sensing device may be integrated in a common silicon substrate.

The first photo-sensing device, the second photo-sensing device, and the third photo-sensing device may be spaced apart from each other in a horizontal direction.

The image sensor may include a light incident side configured to receive incident light, and the first photoelectric device may be disposed nearer to the light incident side than the first photo-sensing device, the second photo-sensing device, and the third photo-sensing device.

At least one pixel of the second pixel, the third pixel, the fourth pixel, and the fifth pixel may have a different area from a remainder of the second pixel, the third pixel, the fourth pixel, and the fifth pixel.

The third pixel may have a larger area than separate, respective areas of the second pixel, the fourth pixel, and the fifth pixel.

The fourth pixel and the fifth pixel may have a common area.

The image sensor may further include a second photoelectric device positioned on the first photoelectric device, and the second photoelectric device may include a third electrode and a fourth electrode facing each other and an organic photoelectric conversion layer disposed between the third electrode and the fourth electrode and configured to selectively absorb visible light having a maximum absorption wavelength ($\lambda_{max}$) from about 500 nm to about 580 nm.

The first pixel may include a fourth pixel and a fifth pixel configured to sense light having different wavelength spectrums from each other in the visible light wavelength spectrum, the fourth pixel may include a second photo-sensing device configured to selectively absorb second visible light having a maximum absorption wavelength ($\lambda_{max}$) of greater than or equal to about 400 nm and less than about 500 nm, and the fifth pixel may include a third photo-sensing device configured to selectively absorb third visible light having a maximum absorption wavelength ($\lambda_{max}$) of greater than about 580 nm and less than or equal to about 700 nm.

The second photo-sensing device and the third photo-sensing device may be integrated in a common silicon substrate.

The second photo-sensing device and the third photo-sensing device may be spaced apart from each other in a horizontal direction.

The first photoelectric device may be disposed nearer to a light incident side than the second photoelectric device, and the second photoelectric device may be disposed nearer to the light incident side than the second and third photo-sensing devices.

The first pixel may include a first color filter overlapped with the second photo-sensing device and configured to selectively transmit the second visible light, and a second color filter overlapped with a third photo-sensing device and configured to selectively transmit a third visible light, and the second pixel may not include a color filter.

The second photo-sensing device and the third photo-sensing device may be spaced apart from each other in a vertical direction.

The image sensor may further include a third photoelectric device and a fourth photoelectric device positioned on the second photoelectric device, the third photoelectric device may include a fifth electrode and a sixth electrode facing each other and an organic photoelectric conversion layer disposed between the fifth electrode and the sixth electrode and configured to selectively absorb second visible light having a maximum absorption wavelength ($\lambda_{max}$) of greater than or equal to about 400 nm and less than about 500 nm, the fourth photoelectric device may include a seventh electrode and an eighth electrode facing each other and an organic photoelectric conversion layer disposed between the seventh electrode and the eighth electrode and configured to selectively absorb third visible light having a maximum absorption wavelength ($\lambda_{max}$) of greater than about 580 nm and less than or equal to about 700 nm, and the second photoelectric device, the third photoelectric device, and the fourth photoelectric device may be stacked in a vertical direction.

The first pixel and the second pixel may not include a color filter.

The second photoelectric device, the third photoelectric device, and the fourth photoelectric device may be positioned under the first photoelectric device.

In some example embodiments, an electronic device including the image sensor is provided.

In some example embodiments, an image sensor includes an array of at least first and second unit pixel groups. At least the first unit pixel group may include at least one first pixel and a second pixel. The at least one first pixel may be configured to sense light in a visible light wavelength spectrum. The second pixel may be configured to sense light in an infrared light wavelength spectrum. The second pixel may include an infrared light absorption layer configured to selectively absorb light in the infrared wavelength spectrum. The infrared light absorption layer may be between a first electrode and a second electrode.

DETAILED DESCRIPTION

Figure 1:
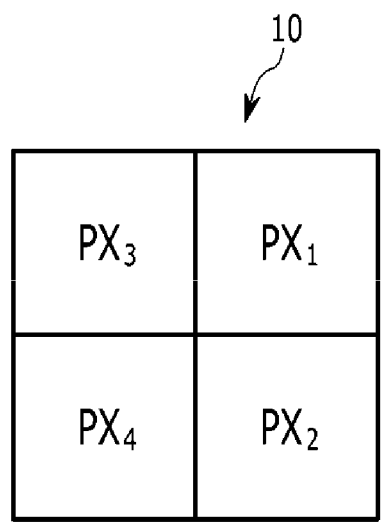
FIG. 1 is a top plan view of a unit pixel group in an image sensor according to some example embodiments.

Example embodiments will hereinafter be described in detail, and may be easily performed by those who have common knowledge in the related art. However, this disclosure may be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it may be directly on the other element or intervening elements may also be present. In contrast, when an element is referred to as being "directly on" another element, there are no intervening elements present.

Hereinafter, an image sensor according to some example embodiments is described. Herein, a CMOS image sensor as an example of an image sensor is described.

The image sensor according to some example embodiments has a pixel array having a matrix arrangement in which unit pixel groups including a plurality of pixels are repeatedly arranged along at least one row and at least one column.

A unit pixel group may include at least one pixel configured to sense light in a visible light wavelength spectrum (hereinafter referred to as 'visible light-sensing pixel') and a pixel configured to sense light in an infrared light wavelength spectrum (hereinafter referred to as 'infrared light-sensing pixel'). The number of pixels included in the unit pixel group may be varied, for example, 2, 4, or 9 and the like, but is not limited thereto.

FIG. 1 is a top plan view showing a unit pixel group of an image sensor according to some example embodiments.

Referring to FIG. 1, the unit pixel group 10 of an image sensor according to some example embodiments includes pixels 1 to 4 $PX_1$, $PX_2$, $PX_3$, $PX_4$ arranged in two rows and two columns (2×2). Three of $PX_1$, $PX_2$, $PX_3$, and $PX_4$ may be primary pixels to sense full color, and the last one may be an auxiliary pixel to compensate the luminance sensitivity of the image sensor under various illumination environments, including low-illumination environments. The primary pixels and the auxiliary pixel may be added or omitted, if required.

For example, $PX_1$, $PX_2$, and $PX_3$ may be visible light sensing pixels, and $PX_4$ may be an infrared light sensing pixel.

The visible light sensing pixels, which are $PX_1$, $PX_2$, and $PX_3$ may detect light having different wavelength spectra from each other in the visible light wavelength spectrum. For example, among the visible light sensing pixels, $PX_1$ may be a pixel sensing visible light having a maximum absorption wavelength ($\lambda_{max}$) of about 500 nm to about 580 nm; $PX_2$ may be a pixel sensing visible light having a maximum absorption wavelength ($\lambda_{max}$) of greater than or equal to about 400 nm and less than about 500 nm; and $PX_3$ may be a pixel sensing visible light having a maximum absorption wavelength ($\lambda_{max}$) of greater than about 580 nm and less than or equal to about 700 nm. $PX_1$ may be a green pixel configured to selectively sense green light, $PX_2$ may be a blue pixel configured to selectively sense blue light, and $PX_3$ may be a red pixel configured to selectively sense red light. However, it is not limited thereto, and the arrangement and the order of pixels may be changed.

$PX_4$, which is an infrared light-sensing pixel, may be a pixel configured to selectively sense infrared light having a maximum absorption wavelength ($\lambda_{max}$) of greater than about 700 nm. Within the range, it may have a maximum absorption wavelength ($\lambda_{max}$), for example, from greater than about 700 nm to 3 μm, and within the range, the maximum absorption wavelength ($\lambda_{max}$) may be, for example, from about 800 nm to about 1500 nm.

Figure 2:
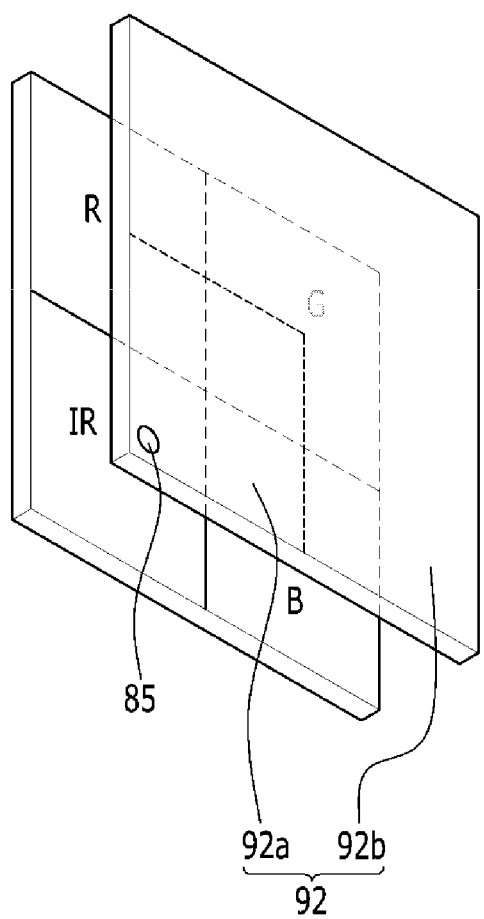
FIG. 2 is a schematic top plan view of a unit pixel group of an image sensor according to some example embodiments.
Figure 3:
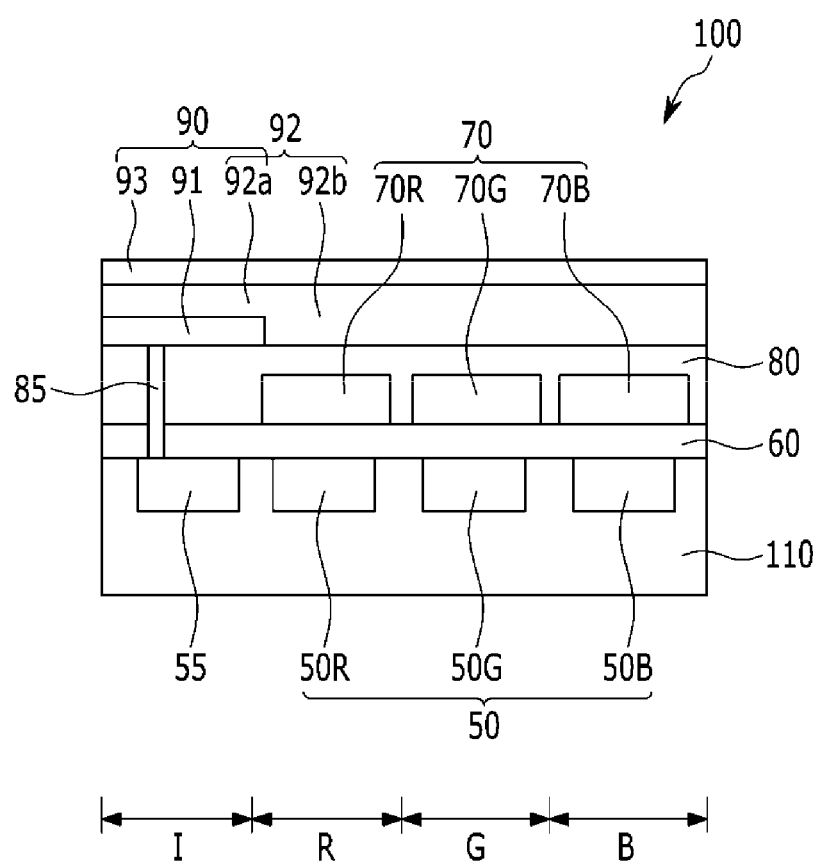
FIG. 3 is a schematic cross-sectional view of the image sensor of FIG. 2.

FIG. 2 is a top plan view schematically showing a unit pixel group of image sensor according to some example embodiments, and FIG. 3 is a cross-sectional view schematically showing an image sensor of FIG. 2.

In FIG. 2 and FIG. 3, for better understanding and ease of description, the visible light-sensing pixels are exemplified with a green pixel (G), a blue pixel (B), and a red pixel (R), but are not limited thereto. In addition, the arrangement and the organization of the green pixel (G), the blue pixel (B), and the red pixel (R) shown in FIG. 2 and FIG. 3 may be variously changed.

Referring to FIGS. 2 and 3, an image sensor 100 according to some example embodiments includes a semiconductor substrate 110, a lower insulation layer 60, a color filter layer 70, an upper insulation layer 80, and an infrared light photoelectric device 90.

The semiconductor substrate 110 may be a silicon substrate, and is integrated with a photo-sensing device 50, a transmission transistor (not shown), and a charge storage 55. The photo-sensing devices 50 may be, for example, a photodiode.

The photo-sensing device 50, transmission transistor (not shown), and charge storage 55 may be integrated in each pixel, and for example, a green photo-sensing device 50G and a transmission transistor may be integrated in each green pixel (G), a blue photo-sensing device 50B and a transmission transistor may be integrated in each blue pixel (B), a red photo-sensing device 50R and a transmission transistor may be integrated in each red pixel (R), and a charge storage 55 and a transmission transistor may be integrated in each infrared light sensing pixel (I). The charge storage 55 is electrically connected with the infrared light photoelectric device 90 that will be described later.

The green photo-sensing device 50G, the blue photo-sensing device 50B, and the red photo-sensing device 50R may be spaced apart from each other in a horizontal direction.

In some example embodiments, when the photo-sensing device 50 senses light, the information sensed by the photo-sensing device 50 may be transferred by the transmission transistor, the charge storage 55 may be electrically connected with the infrared light photoelectric device 90, and the information of the charge storage 55 may be transferred by the transmission transistor.

A metal wire (not shown) and a pad (not shown) may be formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be positioned under the photo-sensing device 50.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench exposing the charge storage 55. The trench may be filled with fillers. The lower insulation layer 60 may be omitted.

The color filter layer 70 is formed on the lower insulation layer 60. The color filter layer 70 may be formed in the visible light-sensing pixel, and may be formed with a color filter configured to selectively transmit light having different wavelength spectra from each other according to each visible light-sensing pixel in the visible light wavelength spectrum. For example, the green pixel (G) may be formed with a green filter 70G configured to selectively transmit green light having a maximum absorption wavelength ($\lambda_{max}$) from about 500 nm to about 580 nm; the blue pixel (B) may be formed with a blue filter 70B configured to selectively transmit green light having a maximum absorption wavelength ($\lambda_{max}$) of greater than or equal to about 400 nm and less than about 500 nm; and the red pixel (R) may be formed with a red filter 70R configured to selectively transmit a red light having a maximum absorption wavelength ($\lambda_{max}$) of greater than about 580 nm and less than or equal to about 700 nm.

The green filter 70G may be configured to selectively transmit light in a green wavelength spectrum to a green photo-sensing device 50G; the blue filter 70B may be configured to selectively transmit light in a blue wavelength spectrum to a blue photo-sensing device 50B; and the red filter 70R may be configured to selectively transmit light in a red wavelength spectrum to a red photo-sensing device 50R.

The color filter layer 70 may be omitted.

The upper insulation layer 80 is formed on the color filter 70. The upper insulation layer 80 may eliminate a step caused by the color filter layer 70 and smoothen the surface. The upper insulation layer 80 and the lower insulation layer 60 may include a contact hole (not shown) exposing a pad, and a through-hole 85 exposing the charge storage 55.

A pixel electrode 91 is formed on the upper insulation layer 80. The pixel electrode 91 is defined in the infrared light-sensing pixel (I) and is not formed in the red pixel (R), the green pixel (G), and the blue pixel (B).

An infrared light absorption layer 92 may be formed on the pixel electrode 91 to selectively absorb light in an infrared light wavelength spectrum. The infrared spectrum may include, for example, all of a near-infrared spectrum, a mid-infrared spectrum, and a far-infrared spectrum.

The infrared light absorption layer 92 may be configured to selectively absorb light having a maximum absorption wavelength ($\lambda_{max}$) of, for example, greater than about 700 nm, within the range, it may selectively absorb light having a maximum absorption wavelength ($\lambda_{max}$) of, for example, greater than about 700 nm to about 3 μm; and within the range, it may selectively absorb light having a maximum absorption wavelength ($\lambda_{max}$) of, for example, about 800 nm to about 1500 nm. The light in other wavelength spectra besides the infrared light wavelength spectrum may be passed through the infrared light absorption layer 92.

The infrared light absorption layer 92 may include, for example, a p-type semiconductor and an n-type semiconductor, and the p-type semiconductor and the n-type semiconductor may form a pn junction. At least one of the p-type semiconductor and the n-type semiconductor may be configured to selectively absorb light in an infrared light wavelength spectrum, and may selectively absorb light in an infrared light wavelength spectrum to generate excitons, and then the generated excitons may be separated into holes and electrons to provide a photoelectric effect.

The p-type semiconductor and the n-type semiconductor may include at least one organic material. The organic material may be any material that is configured to selectively absorb light in an infrared spectrum without particular limitation, and at least one of the p-type semiconductor and the n-type semiconductor may include, for example, a quinoid metal complex compound, a cyanine compound, an immonium compound, a diimmonium compound, a triarylmethane compound, a dipyrromethene compound, a diquinone compound, a naphthoquinone compound, an anthraquinone compound, a squarylium compound, a rylium compound, a ryleme compound, a phthalocyanine compound, a naphthalocyanine compound, a perylene compound, a squaraine compound, a boron dipyrromethene compound, a nickel-dithiol complex compound, merocyanine, diketopyrrolopyrrole, a derivative thereof, or a combination thereof, but is not limited thereto. For example, the p-type semiconductor may be merocyanine, diketopyrrolopyrrole, a boron dipyrromethene compound, a naphthalocyanine compound, a squaraine compound, a derivative thereof, or a combination thereof, and the n-type semiconductor may be C60, C70, thiophene, a derivative thereof, or a combination thereof, but is not limited thereto.

The infrared light absorption layer 92 may be a single layer or a multilayer. The infrared light absorption layer 92 may be, for example, an intrinsic layer (I layer), a p-type layer/I layer, an I layer/n-type layer, a p-type layer/I layer/n-type layer, a p-type layer/n-type layer, and the like.

The intrinsic layer may include the p-type semiconductor and the n-type semiconductor in a volume ratio of about 1:100 to about 100:1. The p-type semiconductor and the n-type semiconductor may be mixed in a volume ratio of about 1:50 to about 50:1, about 1:10 to about 10:1, or about 1:1. When the p-type and n-type semiconductors have a composition ratio within the range, an exciton may be effectively produced and a pn junction may be effectively formed.

The p-type layer may include the p-type semiconductor, and the n-type layer may include the n-type semiconductor.

The infrared light absorption layer 92 may have a thickness of about 1 nm to about 500 nm, and for example, about 5 nm to about 300 nm. Within the thickness range, the infrared light absorption layer 92 may be configured to effectively absorb light in an infrared light wavelength spectrum, effectively separate holes from electrons, and deliver them, thereby effectively improving photoelectric conversion efficiency of the image sensor 100.

The infrared light absorption layer 92 may be formed on an entirety of the surface of the image sensor 100. Thereby, the infrared light may be absorbed on the entire surface of the image sensor, so the light area is increased to provide high light absorptive efficiency.

A common electrode 93 is formed on the infrared light absorption layer 92. The common electrode 93 may be formed on the entire surface of the infrared light absorption layer 92 or may be selectively formed in the region where it is overlapped with the pixel electrode 91.

Either the pixel electrode 91 or the common electrode 93 is an anode, and the other is a cathode. For example, the pixel electrode 91 may be an anode, and the common electrode 93 may be a cathode.

Both the pixel electrode 91 and the common electrode 93 may be light-transmitting electrodes or semi light-transmitting electrodes. The light-transmitting electrode or the semi light-transmitting electrode may be made of, for example, a transparent conductor such as indium tin oxide (ITO) or indium zinc oxide (IZO), or may be a metal thin layer having a thin thickness of several nanometers or several tens of nanometers or a metal thin layer having a thin thickness of several nanometers to several tens of nanometers doped with a metal oxide.

One of the pixel electrode 91 and the common electrode 93 may be a reflecting electrode, and for example, the pixel electrode 91 may be a reflecting electrode. The reflecting electrode may be made of opaque metals, for example, aluminum, copper, silver, or the like.

The infrared light absorption layer 92 includes a photoelectric conversion region 92a positioned between the pixel electrode 91 and the common electrode 93 in the infrared light-sensing pixel (I), and a non-photoelectric conversion region 92b positioned on the red pixel (R), the green pixel (G), and the blue pixel (B).

The pixel electrode 91, the common electrode 93, and the photoelectric conversion region 92a of the infrared ray absorption layer 92 positioned in regions defined by the pixel electrode 91 and the common electrode 93 form the infrared light photoelectric device 90. In some example embodiments, when light enters the infrared light absorption layer 92 from the common electrode 93, and then light in the infrared light wavelength spectrum is selectively absorbed by the infrared light absorption layer 92, excitons may be generated in the photoelectric conversion region 92a of the infrared light absorption layer 92. The excitons are separated into holes and electrons, the separated holes are transferred to an anode, which is one of the pixel electrode 91 and the common electrode 93, and the separated electrons are transferred into a cathode, which is one of the pixel electrode 91 and the common electrode 93, so as to induce an electrical current. The separated electrons or holes may be gathered to the charge storage 55 through the pixel electrode 91.

The non-photoelectric conversion region 92b of the infrared light absorption layer 92 may be configured to selectively absorb light in the infrared light wavelength spectrum and may transmit light in other light wavelength spectra besides the infrared light wavelength spectrum. Accordingly, the non-photoelectric conversion region 92b of the infrared light absorption layer 92 is positioned on the red pixel (R), the green pixel (G), and the blue pixel (B), and may act as an infrared light filter layer (IR filter layer) to prevent light in the infrared light wavelength spectrum from flowing in the green photo-sensing device 50G, the blue photo-sensing device 50B, and the red photo-sensing device 50R. Accordingly, an additional infrared light filter may be omitted from the outside of the image sensor 100.

A focusing lens (not shown) may be further formed on the common electrode 93. The focusing lens may control a direction of incident light and gather the light in one region. The focusing lens may have a shape of, for example, a cylinder or a hemisphere, but is not limited thereto.

The image sensor according to some example embodiments includes a visible light-sensing pixel configured to sense light in a visible light wavelength spectrum and an infrared photo-sensing device configured to sense light in an infrared light wavelength spectrum. The image sensor may be configured to mitigate deterioration of the luminance sensitivity of the image sensor under a low-illumination environment. A low-illumination environment may include, for example, an environment having an illumination of less than about 11 lux. Thus, the image sensor may be configured to generate high-contrast, high-resolution images of various environments under an expansive range of environment illumination.

In addition, by disposing the infrared ray absorption layer 92 on the visible light sensing pixel, light in the infrared light wavelength spectrum flowing into the visible light-sensing pixel may be preliminarily blocked. As a result, an additional infrared light filter (IR filter) may be omitted from the visible light-sensing pixel.

In addition, the infrared light-sensing pixel may be separated from the visible light-sensing pixel, so the infrared light signal transmission structure between the infrared light photoelectric device 90 and the charge storage 55 does not penetrate through the visible light-sensing pixel. Thereby, the structure and the process may be simplified. In some example embodiments, by separately providing an infrared-sensing pixel, the aperture ratio of the visible light-sensing pixel in the image sensor may be improved, and the process may be simplified, relative to the aperture ratio of the visible light-sensing pixel in an image sensor in which a signal transmission structure is positioned in the visible light-sensing pixel.

In addition, when the infrared light-sensing pixel is separated from the visible light-sensing pixel, a pixel electrode 91 for the infrared light photoelectric device 90 may be omitted from the visible light-sensing pixel, thereby mitigating deterioration of visible light transmittance due to absorption and/or reflection of a part of visible light by the pixel electrode 91. Accordingly, deterioration of transmittance of visible light flowing in the visible light-sensing pixel may be mitigated. Thus, efficiency of the image sensor may be prevented from being deteriorated.

Figure 4:
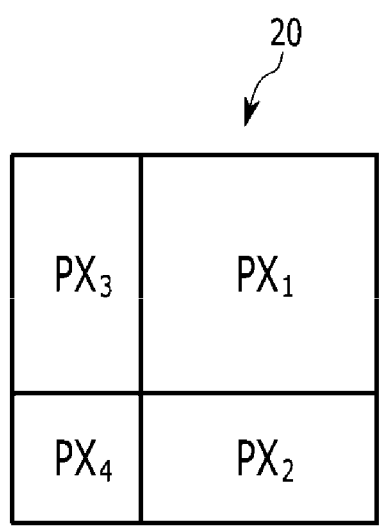
FIG. 4 is a top plan view of a unit pixel group of an image sensor according to some example embodiments.

FIG. 4 is a top plan view showing a unit pixel group of an image sensor according to some example embodiments.

Referring to FIG. 4, the unit pixel group 20 of image sensor according to the present embodiment includes $PX_1$, $PX_2$, $PX_3$, and $PX_4$ which are arranged along two rows and two columns.

In some example embodiments, at least one pixel of $PX_1$, $PX_2$, $PX_3$, and $PX_4$ may have a different area from the others. Each pixel area of the unit pixel group 20 may be variously changed, if required.

For example, $PX_1$ may have a larger area than $PX_2$, $PX_3$, and $PX_4$.

In another example, $PX_2$ and $PX_3$ may have the same area.

In another example, $PX_1$ may have the largest area, and $PX_2$, $PX_3$, and $PX_4$ may have a common area.

In another example, $PX_1$ may have the largest area, $PX_2$ and $PX_3$ may have a common area, and $PX_4$ may have the smallest area.

In another example, $PX_1$ may have the largest area, $PX_2$ and $PX_3$ may have the smallest area, and $PX_4$ may have an area that is smaller than the area of $PX_1$ and larger than the area of $PX_2$ or the area of $PX_3$.

In another example, $PX_1$ may be a green pixel (G), $PX_2$ may be a blue pixel (B), $PX_3$ may be a red pixel (R), and $PX_4$ may be an infrared light-sensing pixel (I).

In another example, the green pixel (G) may have the larger area than the area of the red pixel (R), the blue pixel (B), and the infrared light-sensing pixel (I).

In another example, the red pixel (R) and the blue pixel (B) may have a common area.

In another example, the green pixel (G) may have the largest area, and the red pixel (R), the blue pixel (B), and the infrared light-sensing pixel (I) may have a common area.

In another example, the green pixel (G) may have the largest area, the red pixel (R) and the blue pixel (B) may have a common area, and the infrared light-sensing pixel (I) may have the smallest area.

In another example, the green pixel (G) may have the largest area, the red pixel (R) and the blue pixel (B) may have the smallest area, and the infrared light-sensing pixel (I) may have an area that is smaller than the area of the green pixel (G) and larger than the area of the red pixel (R) or the area of the blue pixel (B).

In some example embodiments, by providing each pixel of the unit pixel group 20 with the different area, even if the area of the visible light-sensing pixel is decreased due to the infrared light-sensing pixel (I), the image sensor may be configured to mitigate deterioration of the visible light-sensing efficiency of the image sensor. Furthermore, the image sensor may be configured to generate images having one or more of improved resolution and improved contrast based on an adjusted visible light-sensing pixel ratio resulting from providing each pixel of the unit pixel group 20 with the different area.

Hereinafter, the image sensor according to some example embodiments is described.

The image sensor according to some example embodiments has a pixel arrangement in which the unit pixel groups including a plurality of pixels are repeatedly arranged along a row and a column.

The unit pixel group may include a visible light-sensing pixel including one, two, or more pixels and an infrared light-sensing pixel.

The visible light-sensing pixel may include one or two of a pixel sensing visible light having a maximum absorption wavelength ($\lambda_{max}$) from about 500 nm to 580 nm, a pixel sensing visible light having a maximum absorption wavelength ($\lambda_{max}$) of greater than or equal to about 400 nm and less than about 500 nm, and a pixel sensing visible light having a maximum absorption wavelength ($\lambda_{max}$) of greater than about 580 nm and less than or equal to about 700 nm. For example, the visible light-sensing pixel may include one or two of a green pixel (G) including a green photo-sensing device, a blue pixel (B) including a blue photo-sensing device, and a red pixel (R) including a red photo-sensing device.

For example, the visible light-sensing pixel may include a blue pixel (B) including a blue photo-sensing device and a red pixel (R) including a red photo-sensing device, and the unit pixel group including the infrared light-sensing pixel (I), the blue pixel (B), and the red pixel (R) may be alternately arranged along a row and a column. The number of pixels included in the unit pixel group may be varied, for example, the unit pixel group may include nine pixels, but is not limited thereto. For example, when the unit pixel group includes nine pixels, four blue pixels (B), four red pixels (R), and one infrared light-sensing pixel (I) are arranged in three rows and three columns (3×3), but is not limited thereto.

In some example embodiments, the image sensor may omit any one or more of the visible light-sensing pixels, and one or more photo-sensing devices of the one or more omitted pixels may be stacked in a vertical direction. As a result, the area of an image sensor may be reduced without deterioration in image resolution and luminance sensitivity of the image sensor.

The infrared light-sensing pixel may be a pixel configured to selectively sense infrared light having a maximum absorption wavelength ($\lambda_{max}$) of greater than about 700 nm. Within the range, the infrared light-sensing pixel may be configured to sense light having a maximum absorption wavelength ($\lambda_{max}$) of, for example, greater than about 700 nm to about 3 µm, and within the range, the maximum absorption wavelength ($\lambda_{max}$) may be, for example, from about 800 nm to about 1500 nm.

Figure 5:
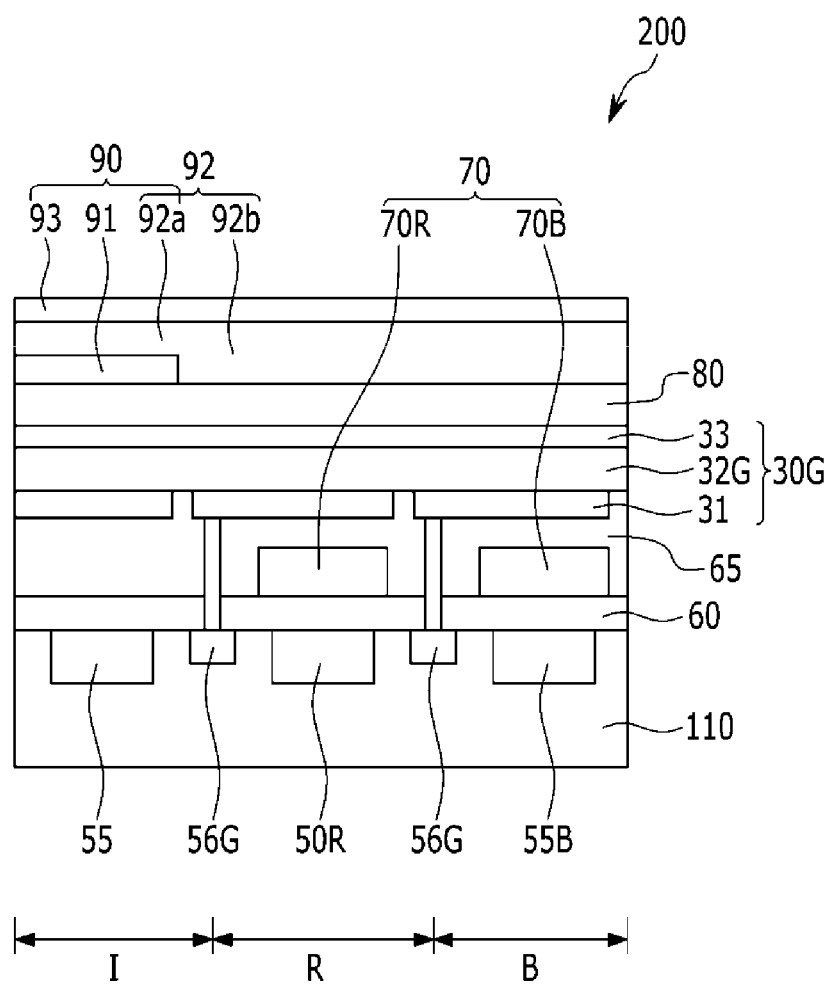
FIG. 5 is a schematic cross-sectional view of an image sensor according to some example embodiments.

FIG. 5 is a schematic cross-sectional view of an image sensor according to some example embodiments.

Referring to FIG. 5, the image sensor 200 according to some example embodiments includes a semiconductor substrate 110, a lower insulation layer 60, a color filter layer 70, an upper insulation layer 80, and an infrared light photoelectric device 90.

The semiconductor substrate 110 may be a silicon substrate, and is integrated with a photo-sensing device 50, a transmission transistor (not shown), and charge storages 55 and 56G. The photo-sensing devices 50 may be, for example, a photodiode.

In some example embodiments, the photo-sensing device 50 includes a red photo-sensing device 50R and a blue photo-sensing device 50B. For example, the red photo-sensing device 50R and the transmission transistor may be integrated in each red pixel (R), and the blue photo-sensing device 50B and the transmission transistor may be integrated in each blue pixel (B). The blue photo-sensing device 50B and the red photo-sensing device 50R may be spaced apart from each other in a horizontal direction.

The photo-sensing device 50 may be configured to sense light, and the information sensed by the photo-sensing device may be transferred by the transmission transistor. The charge storage 55 is electrically connected with the infrared light photoelectric device 90, and the information of the charge storage 55 may be transferred by the transmission transistor. The charge storage 56G may be electrically connected with a green photoelectric device 30G that will be described later, and the information of the charge storage 56G may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be positioned under the photo-sensing device 50.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench exposing the charge storages 55 and 56G. The trench may be filled with fillers. The lower insulation layer 60 may be omitted.

The color filter layer 70 is formed on the lower insulation layer 60. The color filter layer 70 may be formed in a visible light-sensing pixel, and may be formed with a color filter configured to selectively transmit light having the different wavelength spectra according to each visible light-sensing pixel in the visible light wavelength spectrum. For example, the blue filter 70B configured to selectively transmit blue light having a maximum absorption wavelength ($\lambda_{max}$) of greater than or equal to about 400 nm and less than about 500 nm may be formed in a blue pixel (B), and the red filter 70R configured to selectively transmit red light having a maximum absorption wavelength ($\lambda_{max}$) of greater than about 580 nm and less than or equal to about 700 nm may be formed in a red pixel (R).

The blue filter 70B may be configured to selectively transmit light in a blue light wavelength spectrum to a blue photo-sensing device 50B; and the red filter 70R may be configured to selectively transmit light in a red wavelength spectrum to a red photo-sensing device 50R.

The color filter layer 70 may be omitted as needed.

An intermediate insulation layer 65 is formed on the color filter layer 70. The intermediate insulation layer 65 may eliminate a step caused by the color filter layer 70 and smoothen the surface. The intermediate insulation layer 65 and the lower insulation layer 60 may include a contact hole (not shown) exposing a pad, and a trench exposing the charge storages 55 and 56G.

A green photoelectric device 30G is formed on the intermediate insulation layer 65. The green photoelectric device 30G may be configured to selectively sense light in a green wavelength spectrum.

The green photoelectric device 30G includes a pixel electrode 31 and a common electrode 33 facing each other, and a green light absorption layer 32G between the pixel electrode 31 and the common electrode 33. One of the pixel electrode 31 and the common electrode 33 is an anode and the other is a cathode.

The pixel electrode 31 and the common electrode 33 may be light-transmitting electrodes, and the light-transmitting electrode may be made of, for example, a transparent conductor such as indium tin oxide (ITO) or indium zinc oxide (IZO), or may be a metal thin layer having a thin thickness of several nanometers or several tens of nanometers or a metal thin layer having a thin thickness of several nanometers to several tens of nanometers doped with a metal oxide.

The green light absorption layer 32G may selectively absorb light in a green wavelength spectrum and transmit light in other wavelength spectra besides the green wavelength spectrum, including light in a blue wavelength spectrum and a red wavelength spectrum. Blue light may pass through the green photoelectric device 30G and may be sensed by the blue photo-sensing device 50B without deterioration, and red light may pass through the green photoelectric device 30G and may be sensed by the red photo-sensing device 50R without deterioration.

The green light absorption layer 32G may include a p-type semiconductor and an n-type semiconductor, and the p-type semiconductor and the n-type semiconductor may form a pn junction. At least one of the p-type semiconductor and the n-type semiconductor may be configured to selectively absorb light in a green wavelength spectrum, and may be configured to selectively absorb light in a green wavelength spectrum to generate excitons, and then the generated excitons may be separated into holes and electrons to provide a photoelectric effect. The green light absorption layer 32G may replace a green filter 70G. As a result, a size of the image sensor 200 may be reduced, relative to an image sensor that includes a green filter 70G.

Each of the p-type semiconductor and the n-type semiconductor may have an energy bandgap of, for example, about 2.0 to about 2.5 eV, and the p-type semiconductor and the n-type semiconductor may have a LUMO difference of, for example, about 0.2 to about 0.7 eV.

The p-type semiconductor may be, for example, quinacridone or a derivative thereof, or sub-phthalocyanine or a derivative thereof, and the n-type semiconductor may be, for example, a cyanovinyl group-containing thiophene derivative, fullerene, or a fullerene derivative, but are not limited thereto.

The green light absorption layer 32G may be a single layer or a multilayer. The green light absorption layer 32G may be, for example, an intrinsic layer (I layer), a p-type layer/I layer, an I layer/n-type layer, a p-type layer/I layer/n-type layer, a p-type layer/n-type layer, and the like.

The intrinsic layer (I layer) may include the p-type semiconductor and the n-type semiconductor in a thickness ratio of about 1:100 to about 100:1. The p-type semiconductor and the n-type semiconductor may be included in a thickness ratio ranging from about 1:50 to about 50:1 within the range, specifically, about 1:10 to about 10:1, and more specifically, about 1 to about 1. When the p-type and n-type semiconductors have a composition ratio within the range, an exciton may be effectively produced, and a pn junction may be effectively formed.

The p-type layer may include the p-type semiconductor, and the n-type layer may include the n-type semiconductor.

The green light absorption layer 32G may have a thickness of about 1 nm to about 500 nm. Within the range, the green light absorption layer 32G may have a thickness of about 5 nm to about 300 nm. When the green light absorption layer 32G has a thickness within the range, the active layer may effectively absorb light, effectively separate holes from electrons, and deliver them, effectively improving photoelectric conversion efficiency.

The green light absorption layer 32G may be formed on the entire surface of the image sensor 200, and thus light may be absorbed at the entire surface and a light area may be increased, relative to a light area of a green photo-sensing device 50G. As a result, the image sensor 200 may have high green light absorption efficiency.

The green photoelectric device 30G may produce excitons when light enters the green photoelectric device 30G from the common electrode 33, and the green light absorption layer 32G selectively absorbs light in the green wavelength spectrum. Excitons are separated into holes and electrons in the green light absorption layer 32G, the separated holes are moved to the anode which is one of the pixel electrode 31 and the common electrode 33, and the separated electrons are moved to a cathode which is the other of the pixel electrode 31 and the common electrode 33, so as to induce an electrical current. The separated electrons or holes may be collected in a charge storage 56G. Light in other wavelength spectra besides the green wavelength spectrum is passed through the pixel electrode 31 and the color filter layer 70 and sensed by the blue photo-sensing device 50B or the red photo-sensing device 50R.

An upper insulation layer 80 is formed on the green photoelectric device 30G. The upper insulation layer 80 may be, for example, made of an inorganic insulating material such as a silicon oxide and/or a silicon nitride, or a low dielectric constant (low K) material such as SiC, SiCOH, SiCO, and SiOF. The upper insulation layer 80 may be omitted.

A pixel electrode 91 is formed on the upper insulation layer 80. The pixel electrode 91 may be defined in the infrared light-sensing pixel (I), and may not be formed in the red pixel (R) and the blue pixel (B) besides the infrared light-sensing pixel (I).

An infrared light absorption layer 92 configured to selectively absorb light in the infrared wavelength spectrum may be formed on the pixel electrode 91. The infrared wavelength spectrum may include, for example, all of a near infrared wavelength spectrum, a mid-infrared wavelength spectrum, and a far-infrared wavelength spectrum.

The infrared light absorption layer 92 may be configured to selectively absorb light having a maximum absorption wavelength ($\lambda_{max}$) of, for example, greater than about 700 nm, within the range, it may selectively absorb light having a maximum absorption wavelength ($\lambda_{max}$) of, for example, greater than about 700 nm to about 3 μm, and within the range, it may selectively absorb light having a maximum absorption wavelength ($\lambda_{max}$) of, for example, about 800 nm to about 1500 nm.

The infrared light absorption layer 92 may include, for example, a p-type semiconductor and an n-type semiconductor, and the p-type semiconductor and the n-type semiconductor may form a pn junction. At least one of the p-type semiconductor and the n-type semiconductor may selectively absorb light in an infrared spectrum, and may selectively absorb light in an infrared light wavelength spectrum to generate excitons, and then the generated excitons may be separated into holes and electrons to provide a photoelectric effect.

The p-type semiconductor and the n-type semiconductor may include at least one organic material. For example, at least one of the p-type semiconductor and the n-type semiconductor may include at least one of a quinoid metal complex compound, a cyanine compound, an immonium compound, a diimmonium compound, a triarylmethane compound, a dipyrromethene compound, a diquinone compound, a naphthoquinone compound, an anthraquinone compound, a squarylium compound, a rylium compound, a phthalocyanine compound, a naphthalocyanine compound, a perylene compound, a squaraine compound, a boron dipyrromethene compound, a nickel-dithiol complex compound, a merocyanine compound, a diketopyrrolopyrrole compound, a derivative thereof, or a combination thereof, but is not limited thereto. For example, the p-type semiconductor may be merocyanine, diketopyrrolopyrrole, a boron dipyrromethene compound, a naphthalocyanine compound, a squaraine compound, a derivative thereof, or a combination thereof, and the n-type semiconductor may be C60, C70, thiophene, a derivative thereof, or a combination thereof, but is not limited thereto.

The infrared light absorption layer 92 may be a single layer or a multilayer. The infrared light absorption layer 92 may be, for example an intrinsic layer (I layer), a p-type layer/I layer, an I layer/n-type layer, a p-type layer/I layer/n-type layer, a p-type layer/n-type layer, and the like.

The intrinsic layer (I layer) may include the p-type semiconductor and the n-type semiconductor in a volume ratio of about 1:100 to about 100:1. The p-type semiconductor and the n-type semiconductor may be mixed in a volume ratio of about 1:50 to about 50:1, about 1:10 to about 10:1, or about 1:1. When the p-type and n-type semiconductors have a composition ratio within the range, an exciton may be effectively produced and a pn junction may be effectively formed.

The p-type layer may include the p-type semiconductor, and the n-type layer may include the n-type semiconductor.

The infrared light absorption layer 92 may have a thickness of about 1 nm to about 500 nm, and specifically, about 5 nm to about 300 nm. Within the thickness range, the infrared light absorption layer 92 may be configured to effectively absorb light in an infrared wavelength spectrum, effectively separate holes from electrons, and deliver them, thereby effectively improving photoelectric conversion efficiency of the image sensor 200.

The infrared light absorption layer 92 may be formed on an entirety of the surface of the image sensor 200. Thereby, as the infrared light may be absorbed on the whole surface of the image sensor, the light area may be increased to provide high light-absorptive efficiency.

A common electrode 93 is formed on the infrared light absorption layer 92. The common electrode 93 may be formed on the entire surface of the infrared light absorption layer 92 or may be selectively formed on the region where it is overlapped with the pixel electrode 91.

Any one of the pixel electrode 91 and the common electrode 93 is an anode, and the other one is a cathode. For example, the pixel electrode 91 may be an anode, and the common electrode 93 may be a cathode.

Both the pixel electrode 91 and the common electrode 93 may be light-transmitting electrodes or semi light-transmitting electrodes. The light-transmitting electrode or the semi light-transmitting electrode may be made of, for example, a transparent conductor such as indium tin oxide (ITO) or indium zinc oxide (IZO), or may be a metal thin layer having a thin thickness of several nanometers or several tens of nanometers or a metal thin layer having a thin thickness of several nanometers to several tens of nanometers doped with a metal oxide.

One of the pixel electrode 91 and the common electrode 93 may be a reflecting electrode, and for example, the pixel electrode 91 may be a reflecting electrode. The reflecting electrode may be made of opaque metal, for example, aluminum, copper, silver, or the like.

The infrared light absorption layer 92 includes a photoelectric conversion region 92a positioned between the pixel electrode 91 and the common electrode 93 in the infrared light-sensing pixel (I), and a non-photoelectric conversion region 92b positioned at the red pixel (R), the green pixel (G), and the blue pixel (B).

The pixel electrode 91, the common electrode 93, and the photoelectric conversion region 92a of the infrared ray absorption layer 92 positioned at a region defined by the pixel electrode 91 and the common electrode 93 forms an infrared light photoelectric device 90. In some example embodiments, when light is incident on the infrared light absorption layer 92 from the common electrode 93 side, and light in the infrared light wavelength spectrum is selectively absorbed in the infrared light absorption layer 92 to generate exitons in the photoelectric conversion region 92a of the infrared light absorption layer 92. Excitons are separated into holes and electrons, the separated holes are transferred to an anode, which is one of the pixel electrode 91 and the common electrode 92, and the separated electrons are transferred into a cathode side, which is one of the pixel electrode 91 and the common electrode 92, so as to induce an electrical current. The separated electrons or holes may be gathered in charge storage 55 through a pixel electrode 91.

The non-photoelectric conversion region 92b of the infrared light absorption layer 92 may selectively absorb light in the infrared spectrum and may pass light in other wavelength spectra, besides the infrared spectrum. Accordingly, the non-photoelectric conversion region 92b of the infrared light absorption layer 92 is positioned at a red pixel (R) and a blue pixel (B) and plays a role of an infrared light filter layer for preventing light in the infrared light wavelength spectrum from flowing in the green photoelectric device 30G, the blue photo-sensing device 50B, and the red photo-sensing device 50R.

A focusing lens (not shown) may be further formed on the common electrode 93. The focusing lens may control a direction of incident light and gather the light in one region. The focusing lens may have a shape of, for example, a cylinder or a hemisphere, but is not limited thereto.

In some example embodiments, the red photo-sensing device 50R and the blue photo-sensing device 50B are integrated in the semiconductor substrate 110 and that a green photoelectric device 30G is positioned on the whole surface of the image sensor, but it is not limited thereto, and a red photo-sensing device 50R and a green photo-sensing device may be integrated in a semiconductor substrate 110, and a blue photoelectric device is disposed on the whole surface of the image sensor, and a blue photo-sensing device 50B and a green photo-sensing device may be integrated in the semiconductor substrate 110, while a red photoelectric device is disposed on the whole surface of the image sensor.

In addition to the merits of the image sensor according to the above embodiments, the image sensor according to some example embodiments may omit one of the visible light-sensing pixels and reduce the area of image sensor by stacking the photo-sensing device of the omitted pixel in a vertical direction. Such stacking may enable the area of the image sensor to be reduces without reduction in resolution and luminance sensitivity of the image sensor.

Hereinafter, an image sensor according to some example embodiments is described.

Figure 6:
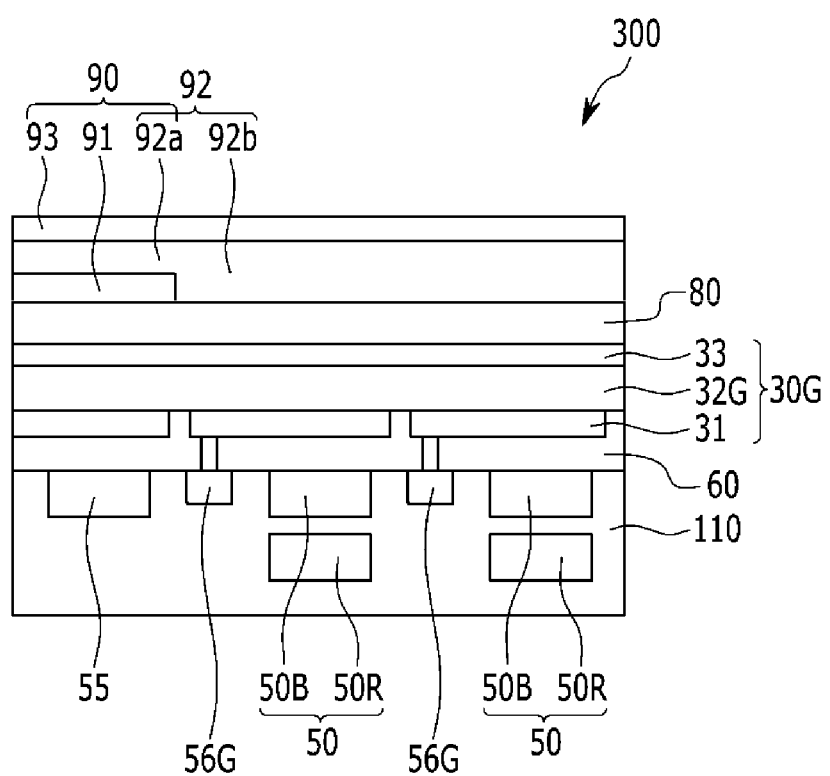
FIG. 6 is a schematic cross-sectional view of an image sensor according to some example embodiments.

FIG. 6 is a schematic cross-sectional view of an image sensor according to some example embodiments.

Referring to FIG. 6, the image sensor 300 according to some example embodiments includes a semiconductor substrate 110, a lower insulation layer 60, a green photoelectric device 30G, an upper insulation layer 80, and an infrared light photoelectric device 90.

The semiconductor substrate 110 may be a silicon substrate, and is integrated with a photo-sensing device 50, a transmission transistor (not shown), and charge storages 55 and 56G. The photo-sensing devices 50 may be, for example, a photodiode.

The photo-sensing device 50 includes a blue photo-sensing device 50B and a red photo-sensing device 50R. In some example embodiments, the blue photo-sensing device 50B and the red photo-sensing device 50R are spaced apart from each other in a vertical direction. The blue photo-sensing device 50B and the red photo-sensing device 50R may selectively absorb light in each wavelength spectrum according to the stacked depth.

A metal wire (not shown) and a pad (not shown) are formed on the semiconductor substrate 110, and a lower insulation layer 60 is formed on the metal wire and the pad. The lower insulation layer 60 may have a contact hole exposing the charge storages 55 and 56G.

In some example embodiments, a color filter is omitted on the lower insulation layer 60. As described above, since the blue photo-sensing device 50B and the red photo-sensing device 50R may selectively absorb light in each wavelength spectrum according to the stacked depth, an additional color filter for separating light in visible light wavelength spectrum according to each pixel is not required.

A green photoelectric device 30G is formed on the lower insulation layer 60. The green photoelectric device 30G may be configured to selectively sense light in a green wavelength spectrum.

The green photoelectric device 30G includes a pixel electrode 31 and a common electrode 33 facing each other and a green light absorption layer 32G between the pixel electrode 31 and the common electrode 33, which are the same as described above.

An upper insulation layer 80 is formed on the green photoelectric device 30G.

A pixel electrode 91 defined in the infrared light-sensing pixel (I) is formed on the upper insulation layer 80. An infrared light absorption layer 92 and a common electrode 93 are sequentially formed on the pixel electrode 91 for selectively absorbing light in the infrared spectrum.

The infrared light absorption layer 92 includes a photoelectric conversion region 92a positioned between the pixel electrode 91 and the common electrode 93 in the infrared light-sensing pixel (I), and a non-photoelectric conversion region 92b in the red pixel (R), the green pixel (G), and the blue pixel (B). The photoelectric conversion region 92a of the infrared light absorption layer 92, together with the pixel electrode 91 and the common electrode 93, forms an infrared light photoelectric device 90, and the non-photoelectric conversion region 92b of the infrared light absorption layer 92 may play a role of an infrared light filter layer blocking light in the infrared light wavelength spectrum from flowing into the green photoelectric device 30G, the blue photo-sensing device 50B, and the red photo-sensing device 50R.

A focusing lens (not shown) may be further formed on the common electrode 93. The focusing lens may control a direction of incident light and gather the light in one region. The focusing lens may have a shape of, for example, a cylinder or a hemisphere, but is not limited thereto.

In some example embodiments, the red photo-sensing device 50R and the blue photo-sensing device 50B are integrated in the semiconductor substrate 110, and the green photoelectric device 30G is disposed on the whole surface of image sensor, but is not limited thereto, and the red photo-sensing device 50R and the green photo-sensing device may be integrated in the semiconductor substrate 110, and the blue photoelectric device may be disposed on the whole surface of the image sensor, while the blue photo-sensing device 50B and the green photo-sensing device are integrated in the semiconductor substrate 110, and the red photoelectric device is disposed on the entire surface of image sensor 300.

As in the above, with the structure in which a green photoelectric device configured to selectively absorb light in the green wavelength spectrum is stacked, and with the structure in which the red photo-sensing device and the blue photo-sensing device are stacked, the size of image sensor 300 may be further decreased to miniaturize the image sensor 300. In addition, by providing the additional infrared light-sensing pixel as above, the image sensor 300 may be configured to prevent the rapid deterioration of luminance sensitivity of the image sensor under a low-illumination environment. Thus, the image sensor may be configured to generate high-contrast, high-resolution images of various environments under an expansive range of illumination environments.

Hereinafter, an image sensor according to some example embodiments is described.

As in the above embodiments, the image sensor according to some example embodiments has a pixel arrangement of a matrix format in which a unit pixel group including a plurality of pixels is repeatedly arranged along a row and a column.

The unit pixel group may include a visible light-sensing pixel (RGB) and an infrared light-sensing pixel (I).

For example, the visible light-sensing pixel (RGB) may be a pixel including a charge storage connected to each of a green photoelectric device, a blue photoelectric device, and a red photoelectric device, and as will be described later, the green photoelectric device, the blue photoelectric device, and the red photoelectric device may be stacked.

The unit pixel group including the visible light-sensing pixel (RGB) and the infrared light-sensing pixel (I) may be alternatively arranged along a row and a column, and the number of pixels included in the unit pixel group may be varied. For example, the unit pixel group may include two pixels, but is not limited thereto. For example, when the unit pixel group includes two pixels, one visible light-sensing pixel (RGB) and one infrared light-sensing pixel (I) may be arranged in one row and two columns (1×2) or two rows and one column (2×1), but is not limited thereto.

Figure 7:
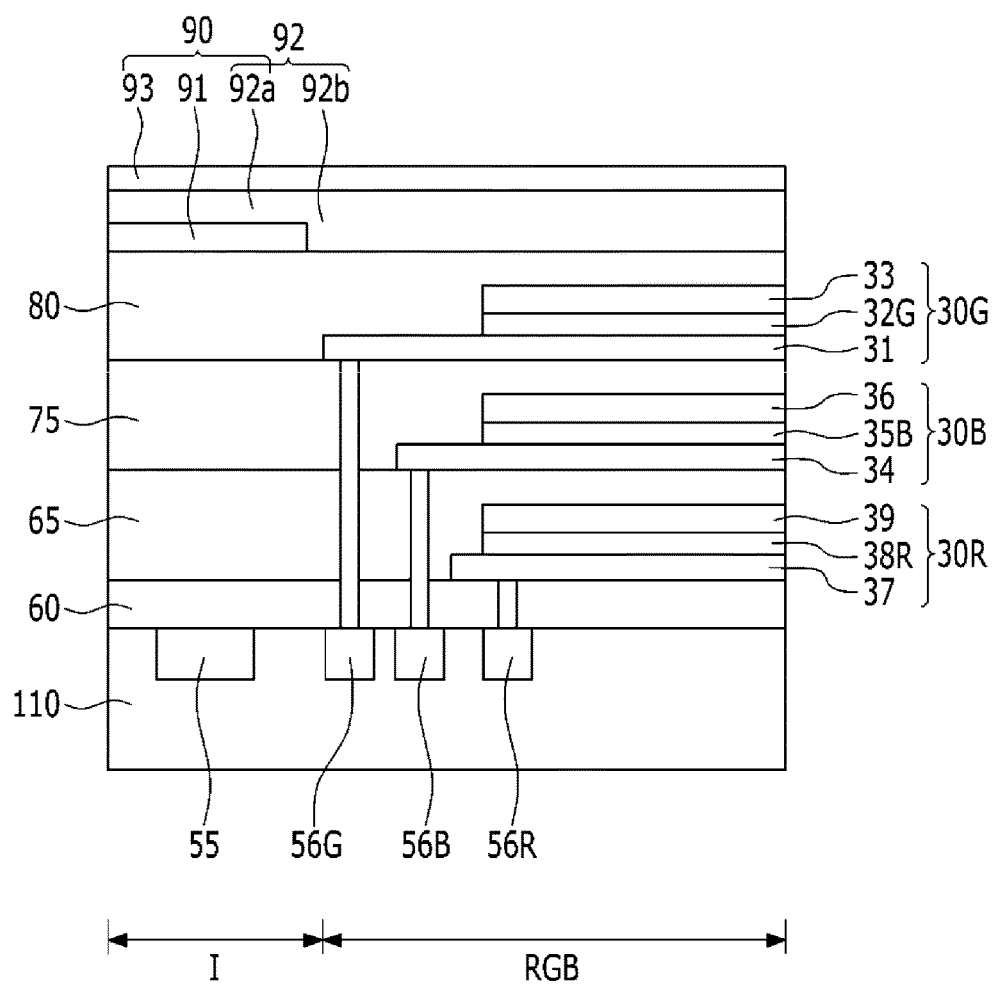
FIG. 7 is a schematic cross-sectional view of an image sensor according to some example embodiments.

FIG. 7 is a schematic cross-sectional view of an image sensor according to some example embodiments.

As shown in FIG. 7, the image sensor 400 according to some example embodiments includes a semiconductor substrate 110, a lower insulation layer 60, a first intermediate insulation layer 65, a second intermediate insulation layer 75, an upper insulation layer 80, a green photoelectric device 30G, a blue photoelectric device 30B, a red photoelectric device 30R, and an infrared light photoelectric device 90.

The semiconductor substrate 110 may be a silicon substrate, and is integrated with a transmission transistor (not shown) and charge storages 55, 56G, 56B, and 56R.

A metal line (not shown) and a pad (not shown) are formed on the semiconductor substrate 110, and a lower insulation layer 60 is formed on the metal line and the pad.

A red photoelectric device 30R is formed on the lower insulation layer 60. The red photoelectric device 30R may be configured to selectively sense light in a red wavelength spectrum.

The red photoelectric device 30R includes a pixel electrode 37 and a common electrode 39, and a red light absorption layer 38R between the pixel electrode 37 and the common electrode 39. One of the pixel electrode 37 and the common electrode 39 is an anode and the other is a cathode.

The pixel electrode 37 and the common electrode 39 may be light-transmitting electrodes, and the light-transmitting electrode may be made of, for example, a transparent conductor such as indium tin oxide (ITO) or indium zinc oxide (IZO), or may be a metal thin layer having a thin thickness of several nanometers or several tens of nanometers or a metal thin layer having a thin thickness of several nanometers to several tens of nanometers doped with a metal oxide.

The red light absorption layer 38R may be configured to selectively sense light in a red wavelength spectrum.

The red light absorption layer 38R may include a p-type semiconductor and an n-type semiconductor, and the p-type semiconductor and the n-type semiconductor may form a pn junction. At least one of the p-type semiconductor and the n-type semiconductor may be configured to selectively absorb light in a red wavelength spectrum, and may be configured to selectively absorb light in a red wavelength spectrum to generate excitons, and then the generated excitons may be separated into holes and electrons to provide a photoelectric effect. The red light absorption layer 38R may replace a red filter.

The red light absorption layer 38R may be a single layer or a multilayer. The red light absorption layer 38R may be, for example, an intrinsic layer (I layer), a p-type layer/I layer, an I layer/n-type layer, a p-type layer/I layer/n-type layer, a p-type layer/n-type layer, and the like. The intrinsic layer may include the p-type semiconductor and the n-type semiconductor, the p-type layer may include the p-type semiconductor, and the n-type layer may include the n-type semiconductor.

The red light absorption layer 38R may have a thickness of about 1 nm to about 500 nm. Within the range, the red light absorption layer 38R may have a thickness of about 5 nm to about 300 nm. When the red light absorption layer 38R has a thickness within the range, the active layer may effectively absorb light, effectively separate holes from electrons, and deliver them, effectively improving photoelectric conversion efficiency.

The red light absorption layer 38R may be formed on the front side of the image sensor 400, and thus light may be absorbed at the front side and a light area may be increased to have high light absorption efficiency.

The red photoelectric device 30R may be configured to produce excitons at the inside when light enters the red photoelectric device 30R from the common electrode 39 and the red light absorption layer 38R selectively absorbs light in the red wavelength spectrum. Excitons are separated into holes and electrons in the red light absorption layer 38R, and the separated holes are moved to the anode which is one of the pixel electrode 37 and the common electrode 39, and the separated electrons are moved to a cathode which is the other of the pixel electrode 37 and the common electrode 39, so as to induce an electrical current. The separated electrons or holes may be collected in charge storage 56R.

A first intermediate insulation layer 65 is formed on the red photoelectric device 30R. The first intermediate insulation layer 65 may be made of an inorganic insulating material such as a silicon oxide and/or a silicon nitride, or a low dielectric constant (low K) material such as SiC, SiCOH, SiCO, and SiOF.

A blue photoelectric device 30B is formed on the first intermediate insulation layer 65.

The blue photoelectric device 30B may be configured to selectively sense light in a blue wavelength spectrum. The blue photoelectric device 30B includes a pixel electrode 34 and a common electrode 36, and a blue light absorption layer 35B between the pixel electrode 34 and the common electrode 36. One of the pixel electrode 34 and the common electrode 36 is an anode and the other is a cathode.

The pixel electrode 34 and the common electrode 36 may be light-transmitting electrodes, and the light-transmitting electrode may be made of, for example, a transparent conductor such as indium tin oxide (ITO) or indium zinc oxide (IZO), or may be a metal thin layer having a thin thickness of several nanometers or several tens of nanometers or a metal thin layer having a thin thickness of several nanometers to several tens of nanometers doped with a metal oxide.

The blue light absorption layer 35B may be configured to selectively absorb light in a blue wavelength spectrum.

The blue light absorption layer 35B may include a p-type semiconductor and an n-type semiconductor, and the p-type semiconductor and the n-type semiconductor may form a pn junction. At least one of the p-type semiconductor and the n-type semiconductor may be configured to selectively absorb light in a blue wavelength spectrum, and may selectively absorb light in a blue wavelength spectrum to generate excitons, and then the generated excitons may be separated into holes and electrons to provide a photoelectric effect. The blue light absorption layer 35B may replace a blue filter.

The blue light absorption layer 35B may be a single layer or a multilayer. The blue light absorption layer 35B may be, for example an intrinsic layer (I layer), a p-type layer/I layer, an I layer/n-type layer, a p-type layer/I layer/n-type layer, a p-type layer/n-type layer, and the like. The intrinsic layer may include the p-type semiconductor and the n-type semiconductor, the p-type layer may include the p-type semiconductor, and the n-type layer may include the n-type semiconductor.

The blue light absorption layer 35B may have a thickness of about 1 nm to about 500 nm. Within the range, the blue light absorption layer 35B may have a thickness of about 5 nm to about 300 nm. When the blue light absorption layer 38B has a thickness within the range, the active layer may effectively absorb light, effectively separate holes from electrons, and deliver them, effectively improving photoelectric conversion efficiency.

The blue light absorption layer 35B may be formed on the front side of the image sensor, and thus light may be absorbed at the front side and a light area may be increased to have high light absorption efficiency.

The blue photoelectric device 30B may be configured to produce excitons at the inside when light enters from the common electrode 36 and the blue light absorption layer 35B selectively absorbs light in the blue wavelength spectrum. Excitons are separated into holes and electrons in the blue light absorption layer 35B, the separated holes are moved to the anode which is one of the pixel electrode 34 and the common electrode 36, and the separated electrons are transferred to a cathode which is the other of the pixel electrode 34 and the common electrode 36, so as to induce an electrical current. The separated electrons or holes may be collected in charge storage 56B.

A second intermediate insulation layer 75 is formed on the blue photoelectric device 30B. The second intermediate insulation layer 75 may be made of an inorganic insulating material such as a silicon oxide and/or a silicon nitride, or a low dielectric constant (low K) material such as SiC, SiCOH, SiCO, and SiOF.

The lower insulation layer 60, the first intermediate insulation layer 65, and the second intermediate insulation layer 75 may have a trench and/or a contact hole exposing the charge storages 55, 56G, 56B, and 56R.

A green photoelectric device 30G is formed on the second intermediate insulation layer 75. The green photoelectric device 30G may be configured to selectively sense light in the green wavelength spectrum.

The green photoelectric device 30G includes a pixel electrode 31 and a common electrode 33 facing each other and a green light absorption layer 32G between the pixel electrode 31 and the common electrode 33, which are the same as described above.

An upper insulation layer 80 is formed on the green photoelectric device 30G. The upper insulation layer 80 may have a trench and/or a contact hole exposing the charge storage 55.

A pixel electrode 91 defined in the infrared light-sensing pixel (I) is formed on the upper insulation layer 80. An infrared light absorption layer 92 and a common electrode 93 are sequentially formed on the pixel electrode 91 to selectively absorb light in the infrared spectrum.

The pixel electrode 91 is defined in the infrared light-sensing pixel (I), and may not be formed in the visible light-sensing pixel (RGB) besides the infrared light-sensing pixel (I).

The infrared light absorption layer 92 includes a photoelectric conversion region 92a disposed between the pixel electrode 91 and the common electrode 93 in the infrared light-sensing pixel (I), and a non-photoelectric conversion region 92b disposed in the visible light-sensing pixel (RGB). The photoelectric conversion region 92a of the infrared light absorption layer 92, together with a pixel electrode 91 and a common electrode 93, may form an infrared light photoelectric device 90, and the non-photoelectric conversion region 92b of the infrared light absorption layer 92 may play a role of the infrared light filter layer blocking light in the infrared light wavelength spectrum from flowing into the green photoelectric device 30G, the blue photoelectric device 30B, and the red photoelectric device 30R.

A focusing lens (not shown) may be further formed on the common electrode 93. The focusing lens may control a direction of incident light and gather the light in one region. The focusing lens may have a shape of, for example, a cylinder or a hemisphere, but is not limited thereto.

The present embodiment shown in FIG. 7 is an example embodiment of the structure in which the red photoelectric device 30R, the blue photoelectric device 30B, and the green photoelectric device 30G are sequentially stacked, but is not limited thereto, and the stacked order may be variously changed.

In some example embodiments, the photo-sensing device and the color filter layer integrated in the semiconductor substrate 110 are omitted, and the red photoelectric device 30R, the blue photoelectric device 30B, and the green photoelectric device 30G are stacked in a vertical direction. Accordingly, in the image sensor according to some example embodiments, one visible light-sensing pixel may be substituted instead of the red pixel, the green pixel, and the blue pixel, so that the area of the image sensor may be significantly decreased.

In addition, as described above, by providing the separated infrared light-sensing pixel, the image sensor shown in FIG. 7 may be configured to prevent the rapid deterioration of luminance sensitivity of the image sensor under a low-illumination environment. Thus, the image sensor may be configured to generate high-contrast, high-resolution images of various environments under an expansive range of environment illumination.

Figure 8:
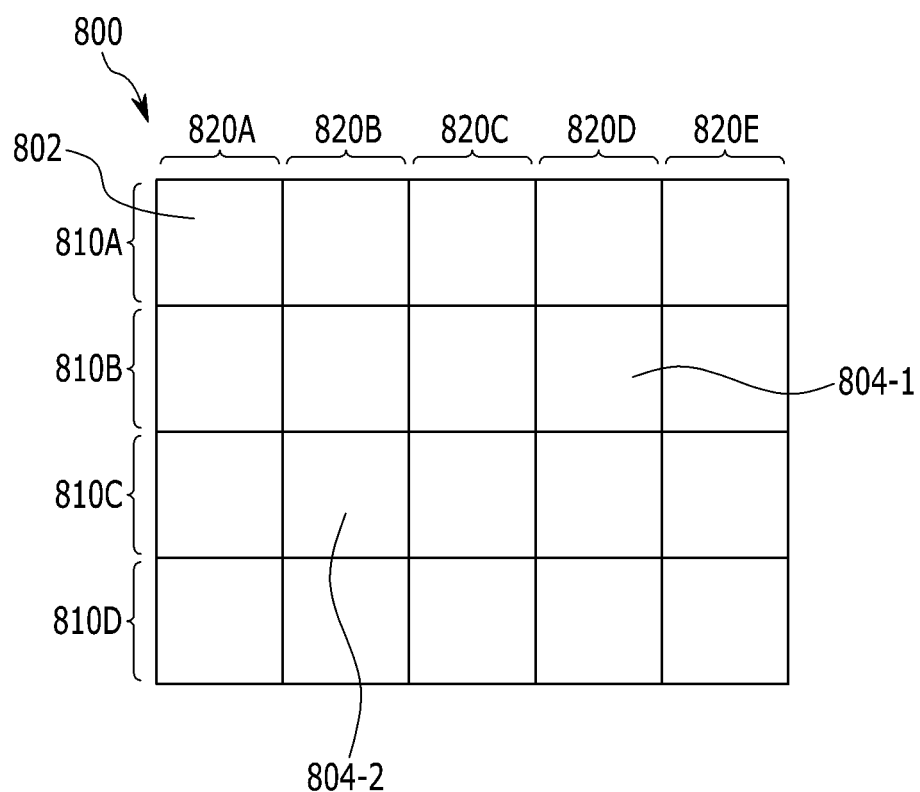
FIG. 8 is a top plan view of an image sensor including multiple unit pixel groups according to some example embodiments.

FIG. 8 is a top plan view of an image sensor including multiple unit pixel groups according to some example embodiments.

The image sensor 800 includes a pixel array of unit pixel groups 802. The pixel array includes a matrix arrangement of unit pixel groups 802, where unit pixel groups are repeatedly arranged along at least one row and at least one column.

As shown in FIG. 8, for example, the image sensor 800 may include multiple unit pixel groups 802 arranged in one or more rows 810A-D and one or more columns 820A-E. The unit pixel groups 802 of image sensor 800 include unit pixel group 804-1 and unit pixel group 804-2. The illustrated image sensor 800 shows twenty (20) unit pixel groups 802 arranged in four (4) rows 810A-D and five (5) columns 820A-E. However, it will be understood that an image sensor 800 may include any quantity of rows of one or more unit pixel groups and any quantity of columns of unit pixel groups. For example, an image sensor 800 may include four (4) unit pixel groups 802 arranged in a "2×2" configuration of two (2) rows 810 and two (2) columns 820 of unit pixel groups 802. In another example, an image sensor 800 may include four (4) unit pixel groups 802 arranged in a "4×1" configuration of one (1) row 810 and four (4) columns 820 of unit pixel groups 802.

In some example embodiments, the image sensor 800 may include at least two different unit pixel groups 802. Different unit pixel groups may include at least two different unit pixel groups that include different arrangements of pixels. For example, unit pixel group 804-1 may be the unit pixel group 10 shown in FIG. 1, where the unit pixel group 804-1 includes four pixels $PX_1$, $PX_2$, $PX_3$, and $PX_4$ arranged in a 2×2 matrix with common area. Unit pixel group 804-2 may be the unit pixel group 20 shown in FIG. 4, where $PX_1$, $PX_2$, $PX_3$, and $PX_4$ have at least partially different areas.

Different unit pixel groups may include at least two different unit pixel groups that include different pixels, devices, etc. For example, unit pixel group 804-1 may include photoelectric devices 30G, 30B, 30R according to the image sensor shown in FIG. 7, while unit pixel group 804-2 may include photo-sensing devices 50G, 50B, 50R according to the image sensor 100 shown in FIG. 3. One or more unit pixel groups 802 may include an infrared light photoelectric device 90. In some example embodiments, an infrared light photoelectric device may be absent from one or more unit pixel groups 802.

In another example, unit pixel groups 804-1 and 804-2 may each include an infrared light sensing pixel, while unit pixel groups 804-1 and 804-2 may include different visible light sensing pixels. Unit pixel group 804-1 may include visible light sensing pixels $PX_1$, $PX_2$ and not $PX_3$ while unit pixel group 804-2 may include visible light sensing pixels $PX_2$, $PX_3$ and not $PX_1$.

In another example, unit pixel groups 804-1 and 804-2 may each include at least one visible light sensing pixel and may include different infrared light sensing pixels. At least one of the unit pixel groups 804-1 and 804-2 may not include an infrared light sensing pixel.

In some example embodiments, the image sensor 800 may include different unit pixel groups 802 arranged according to one or more various particular sequences within the array of rows 810 and columns 820. For example, the unit pixel groups 802 included in column 810A may alternate between unit pixel groups that include photo-sensing devices 50R, 50G, 50B, according to the image sensor 100 shown in FIG. 3, and unit pixel groups that include photo-sensing devices 50R, 50G, and photoelectric device 30G according to the image sensor 200 shown in FIG. 5. In another example, the unit pixel groups included in columns 810A, 810C, and 810E may each include photoelectric devices 30G and 30B and photo-sensing device 50R, while unit pixel groups included in columns 810B and 810D may each include photoelectric devices 30G and 30R and photo-sending device 50B. In another example, the unit pixel groups 802 in columns 820A and 820E and/or rows 810A and 810D may be a first unit pixel group, while unit pixel groups 802 in one of rows 810B-C and one of columns 820B-D may be a second unit pixel group, such that the unit pixel groups bounding the perimeter of the array are a first unit pixel group.

An image sensor 800 that includes different unit pixel groups may have improved average luminance sensitivity due to being configured to generate images via information generated by different unit pixel groups exposed to a common illumination environment. Some unit pixel groups may be configured to provide improved luminance sensitivity than other unit pixel groups under various illumination environments. The image sensor 800 may be configured to mitigate sensitivity deficiencies that may be present in any one particular unit pixel group from contributing to an overall deterioration in image sensor luminance sensitivity. In addition, when at least one first unit pixel group 802 is configured to provide enhanced luminance sensitivity under particular illumination environments where at least one second unit pixel group 802 provides degraded luminance sensitivity under the same particular illumination environments, the first unit pixel group 802 may negate any overall degradation in luminance sensitivity of the image sensor 800 under the particular illumination environments.

The image sensor may be included in various electronic devices. An electronic device may include a mobile phone, a digital camera, a biosensor, and the like, but is not limited thereto.

While this disclosure has been described in connection with what is presently considered to be practical example embodiments, it is to be understood that the inventive concepts are not limited to the described example embodiments, but, on the contrary, is intended to cover various modifications and equivalent arrangements included within the spirit and scope of the appended claims.

What is claimed is:

1. An image sensor, comprising:
a plurality of unit pixel groups repeatedly arranged along a column and a row, wherein each unit pixel group includes,
at least one first pixel configured to sense light in a visible light wavelength spectrum; and
a second pixel configured to sense light in an infrared light wavelength spectrum, the second pixel including a first photoelectric device defined in the second pixel, the first photoelectric device including,
a first electrode, a second electrode, and an infrared light absorption layer between the first electrode and the second electrode, the infrared light absorption layer being configured to selectively absorb light in the infrared light wavelength spectrum,
wherein the infrared light absorption layer is on an entirety of a surface of the unit pixel group, and
wherein the infrared light absorption layer includes a photoelectric conversion region and a non-photoelectric conversion region, the non-photoelectric conversion region being in the at least one first pixel, and the photoelectric conversion region being between the first electrode and the second electrode in the second pixel.

2. The image sensor of claim 1, wherein the infrared light absorption layer includes at least one organic material.

3. The image sensor of claim 2, wherein the infrared light absorption layer includes at least one of a quinoid metal complex compound, a cyanine compound, an immonium compound, a diimmonium compound, a triarylmethane compound, a dipyrromethene compound, a diquinone compound, a naphthoquinone compound, an anthraquinone compound, a squarylium compound, a rylium compound, a ryleme compound, a phthalocyanine compound, a naphthalocyanine compound, a perylene compound, a squaraine compound, a boron dipyrromethene compound, a nickel-dithiol complex compound, a merocyanine compound, and a diketopyrrolopyrrole compound.

4. The image sensor of claim 1, wherein
the at least one first pixel includes a third pixel, a fourth pixel, and a fifth pixel,
the third pixel configured to selectively sense first visible light, the first visible light having a maximum absorption wavelength of about 500 nm to about 580 nm,
the fourth pixel configured to selectively sense second visible light, the second visible light having a maximum absorption wavelength of greater than or equal to about 400 nm and less than about 500 nm, and
the fifth pixel configured to selectively sense third visible light, the third visible light having a maximum absorption wavelength of greater than about 580 nm and less than or equal to about 700 nm.

5. The image sensor of claim 4, wherein
the third pixel includes a first photo-sensing device and a first color filter that is overlapped with the first photo-sensing device, the first color filter being configured to selectively transmit the first visible light,
the fourth pixel includes a second photo-sensing device and a second color filter that is overlapped with the second photo-sensing device, the second color filter being configured to selectively transmit the second visible light,
the fifth pixel includes a third photo-sensing device and a third color filter that is overlapped with the third photo-sensing device, the third color filter being configured to selectively transmit the third visible light; and
the second pixel does not include a color filter.

6. The image sensor of claim 5, further comprising:
a common silicon substrate, wherein the first photo-sensing device, the second photo-sensing device, and the third photo-sensing device are integrated in the common silicon substrate.

7. The image sensor of claim 6, wherein the first photo-sensing device, the second photo-sensing device, and the third photo-sensing device are spaced apart from each other in a horizontal direction.

8. The image sensor of claim 5, further comprising:
a light incident side configured to receive incident light, wherein the first photoelectric device is nearer to the light incident side than the first photo-sensing device, the second photo-sensing device, and the third photo-sensing device.

9. The image sensor of claim 4, wherein at least one pixel of the second pixel, the third pixel, the fourth pixel, and the fifth pixel has a different area from a remainder of the second pixel, the third pixel, the fourth pixel, and the fifth pixel.

10. The image sensor of claim 9, wherein the at least one pixel is the third pixel, and the third pixel has a larger area than separate, respective areas of the second pixel, the fourth pixel, and the fifth pixel.

11. The image sensor of claim 10, wherein the fourth pixel and the fifth pixel have a common area.

12. The image sensor of claim 1, further comprising:
a second photoelectric device on the first photoelectric device, the second photoelectric device including,
a third electrode, a fourth electrode, and a first light absorption layer between the third electrode and the fourth electrode, the first light absorption layer being configured to selectively absorb first visible light, the first visible light having a maximum absorption wavelength of about 500 nm to about 580 nm.

13. The image sensor of claim 12, wherein
the at least one first pixel includes a fourth pixel and a fifth pixel,
the fourth pixel includes a second photo-sensing device, the fourth pixel configured to selectively sense second visible light, the second visible light having a maximum absorption wavelength of greater than or equal to about 400 nm and less than about 500 nm, and
the fifth pixel includes a third photo-sensing device, the fifth pixel configured to selectively sense third visible light, the third visible light having a maximum absorption wavelength of greater than about 580 nm and less than or equal to about 700 nm.

14. The image sensor of claim 13, further comprising:
a light incident side configured to receive incident light, wherein the first photoelectric device is nearer to the light incident side than the second photoelectric device, and wherein the second photoelectric device is nearer to the light incident side than the second photo-sensing device and the third photo-sensing device.

15. The image sensor of claim 13, wherein
the at least one first pixel includes a first color filter and a second color filter,
the first color filter is overlapped with the second photo-sensing device, the first color filter being configured to selectively transmit the second visible light; and
the second color filter is overlapped with the third photo-sensing device, the second color filter being configured to selectively transmit the third visible light; and
the second pixel does not include a color filter.

16. The image sensor of claim 13, further comprising:
a common silicon substrate, wherein the second photo-sensing device and the third photo-sensing device are integrated in the common silicon substrate.

17. The image sensor of claim 16, wherein the second photo-sensing device and the third photo-sensing device are spaced apart from each other in a horizontal direction.

18. The image sensor of claim 16, wherein the second photo-sensing device and the third photo-sensing device are spaced apart from each other in a vertical direction.

19. The image sensor of claim 12, further comprising:
a third photoelectric device and a fourth photoelectric device on one side of the second photoelectric device such that the second photoelectric device, the third photoelectric device, and the fourth photoelectric device are stacked in a vertical direction,
wherein the third photoelectric device includes,
a fifth electrode, a sixth electrode, and a second light absorption layer between the fifth electrode and the sixth electrode, the second light absorption layer being configured to selectively absorb second visible light, the second visible light having a maximum absorption wavelength of greater than or equal to about 400 nm and less than about 500 nm, and
wherein the fourth photoelectric device includes,
a seventh electrode, an eighth electrode, and a third light absorption layer between the seventh electrode and the eighth electrode, the third light absorption layer being configured to selectively absorb third visible light, the third visible light having a maximum absorption wavelength of greater than about 580 nm and less than or equal to about 700 nm.

20. The image sensor of claim 19, wherein the at least one first pixel and the second pixel do not include any color filter.

21. The image sensor of claim 19, wherein the second photoelectric device, third photoelectric device, and fourth photoelectric device are under the first photoelectric device.

22. An electronic device, comprising:
the image sensor of claim 1.

23. An image sensor, comprising:
an array of at least first and second unit pixel groups, at least the first unit pixel group including,
at least one first pixel configured to sense light in a visible light wavelength spectrum; and
a second pixel configured to sense light in an infrared light wavelength spectrum, the second pixel including an infrared light absorption layer configured to selectively absorb light in the infrared light wavelength spectrum, the infrared light absorption layer being between a first electrode and a second electrode,
wherein the infrared light absorption layer is on an entirety of a surface of the unit pixel group,
wherein the infrared light absorption layer includes a photoelectric conversion region and a non-photoelectric conversion region, the non-photoelectric conversion region being in the at least one first pixel, and the photoelectric conversion region being between the first electrode and the second electrode in the second pixel.

24. The image sensor of claim 23, wherein the array includes the first and second unit pixel groups arranged according to a particular sequence.

25. The image sensor of claim 23, wherein
the second unit pixel group includes at least one third pixel configured to sense light in a visible light wavelength spectrum;
the at least one third pixel includes at least one device, the at least one device being at least one of a photo-sensing device, a photoelectric device, and light absorption layer; and
the at least one device is absent from the first unit pixel group.

26. The image sensor of claim 23, wherein
the infrared light absorption layer is on an entirety of a surface of the first unit pixel group; and
the infrared light absorption layer includes a photoelectric conversion region and a non-photoelectric conversion region, the non-photoelectric conversion region being in the at least one first pixel, and the photoelectric conversion region being between the first electrode and the second electrode in the second pixel.

27. The image sensor of claim 23, wherein
the at least one first pixel includes a plurality of photo-sensing devices configured to selectively sense separate, respective wavelength spectra of visible light.

28. The image sensor of claim 23, further comprising:
a first light absorption layer stacked with the infrared light absorption layer in a vertical direction, the first light absorption layer being configured to selectively absorb a particular wavelength spectrum of visible light.

29. An image sensor, comprising:
unit pixel groups repeatedly arranged along a column and a row, wherein each unit pixel group includes,
at least one first pixel configured to sense light in a visible light wavelength spectrum; and
a second pixel configured to sense light in an infrared light wavelength spectrum, the second pixel including a first photoelectric device defined in the second pixel, the first photoelectric device including,
a first electrode, a second electrode, and an infrared light absorption layer between the first electrode and the second electrode, the infrared light absorption layer being configured to selectively absorb light in the infrared light wavelength spectrum,
wherein the infrared light absorption layer is on an entirety of a surface of the unit pixel group,
wherein the infrared light absorption layer includes a photoelectric conversion region and a non-photoelectric conversion region, the non-photoelectric conversion region being in the at least one first pixel, and the photoelectric conversion region being between the first electrode and the second electrode in the second pixel,
wherein,
the at least one first pixel includes a third pixel, a fourth pixel, and a fifth pixel,
the third pixel is configured to selectively sense green light, the third pixel includes a first photo-sensing device and a first color filter that is overlapped with the first photo-sensing device, the first color filter being between the first photoelectric device and the first photo-sensing device, the first color filter being configured to selectively transmit the green light,
the fourth pixel is configured to selectively sense blue light, the fourth pixel includes a second photo-sensing device and a second color filter that is overlapped with the second photo-sensing device, the second color filter being between the first photoelectric device and the second photo-sensing device, the second color filter being configured to selectively transmit the blue light, and the fifth pixel is configured to selectively sense red light, the fifth pixel includes a third photo-sensing device and a third color filter that is overlapped with the third photo-sensing device, the third color filter being between the first photoelectric device and the third photo-sensing device, the third color filter being configured to selectively transmit the red light, the first color filter, second color filter, and the third color filter are on a common side of the first photoelectric device, and the second pixel does not include a color filter.

* * * * *